(12) United States Patent
Lee et al.

(10) Patent No.: US 8,354,735 B2
(45) Date of Patent: Jan. 15, 2013

(54) SEMICONDUCTOR CHIPS HAVING GUARD RINGS AND METHODS OF FABRICATING THE SAME

(75) Inventors: Jung-Do Lee, Uiwang-si (KR); Jongkook Kim, Hwaseong-si (KR); Seok Won Lee, Seongnam-si (KR); Jaesik Lee, Hwaseong-si (KR); Hohyeuk Im, Seoul (KR); Su-min Park, Ansan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 239 days.

(21) Appl. No.: 12/875,382

(22) Filed: Sep. 3, 2010

(65) Prior Publication Data

US 2011/0057297 A1    Mar. 10, 2011

(30) Foreign Application Priority Data

Sep. 4, 2009   (KR) .................. 10-2009-0083632

(51) Int. Cl.
*H01L 23/544* (2006.01)

(52) U.S. Cl. ................. 257/620; 257/401; 257/E23.179

(58) Field of Classification Search .................. 257/401, 257/409, 620, E23.179
See application file for complete search history.

(56) References Cited

U.S. PATENT DOCUMENTS

| | | | |
|---|---|---|---|
| 2007/0029641 A1* | 2/2007 | Hamatani et al. | 257/620 |
| 2008/0067690 A1 | 3/2008 | Kumagai | |
| 2009/0008750 A1* | 1/2009 | Tokitoh | 257/629 |
| 2009/0321890 A1* | 12/2009 | Jeng et al. | 257/620 |
| 2010/0072635 A1* | 3/2010 | Kuo et al. | 257/797 |

FOREIGN PATENT DOCUMENTS

| | | |
|---|---|---|
| JP | 2008-098605 | 4/2008 |
| KR | 1020070078589 | 8/2007 |
| KR | 1020080010667 | 1/2008 |
| KR | 1020080025305 | 3/2008 |

* cited by examiner

*Primary Examiner* — Benjamin Sandvik
*Assistant Examiner* — Whitney T Moore
(74) *Attorney, Agent, or Firm* — F. Chau & Associates, LLC

(57) ABSTRACT

Provided is a semiconductor chip. The semiconductor chip includes a semiconductor substrate including a main chip region and a scribe lane region surrounding the main chip region. An insulating layer is disposed over the semiconductor substrate. A guard ring is disposed in the insulating layer in the scribe lane region. The guard ring surrounds at least a portion of the main chip region. The guard ring has a brittleness greater than a brittleness of the insulating layer.

20 Claims, 12 Drawing Sheets

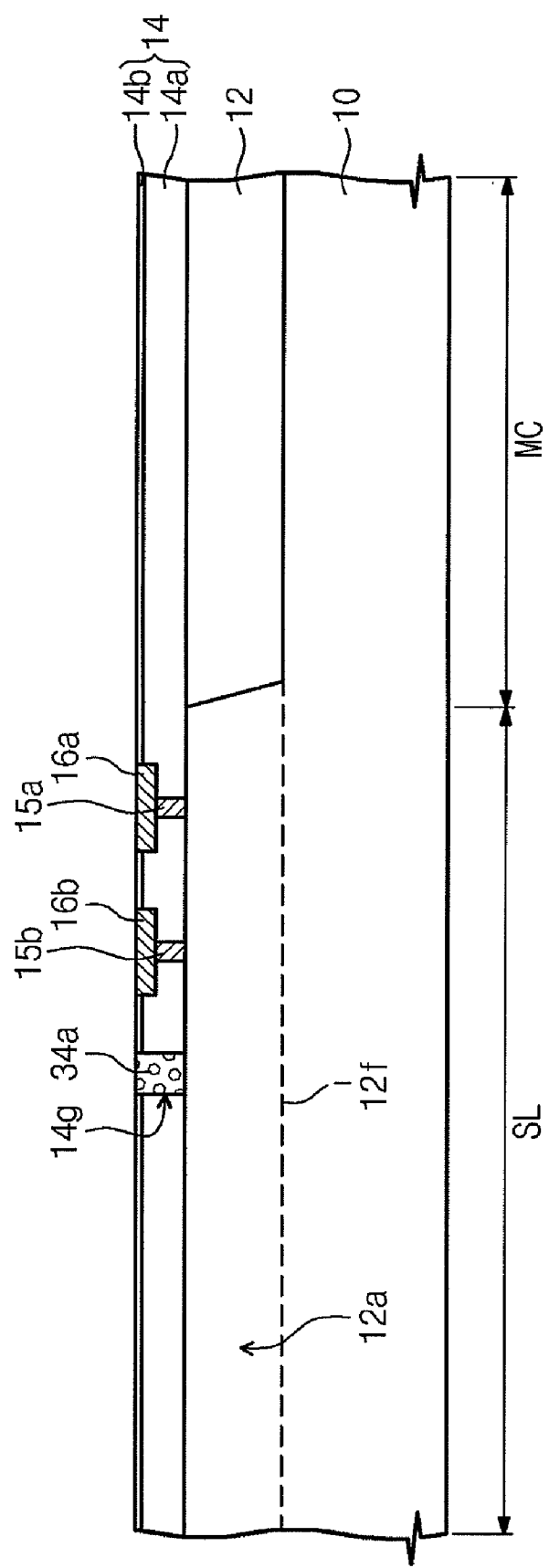

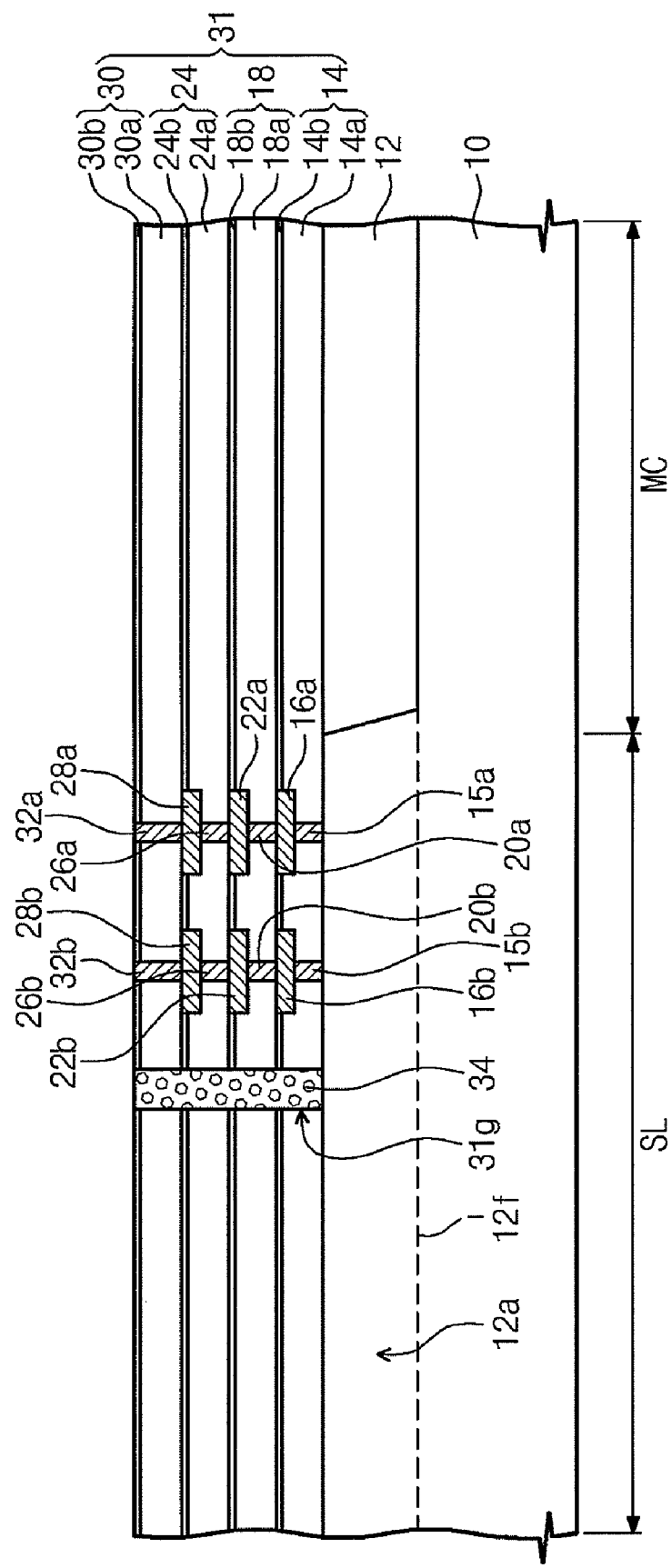

SEMICONDUCTOR CHIPS HAVING GUARD RINGS AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2009-0083632, filed on Sep. 4, 2009, the disclosure of which is hereby incorporated by reference herein in it's entirety.

BACKGROUND

The present disclosure herein relates to semiconductor chips and methods of fabricating the same, and more particularly, to semiconductor chips having guard rings and method of fabricating the same.

Semiconductor devices may include integrated circuits having specific functions. The integrated circuits may be completed by fanning a number of discrete devices in a limited area of a semiconductor substrate. The discrete devices may include active elements such as transistors and passive elements such as resistors and capacitors.

The integrated circuits may be formed in main chip regions of the semiconductor substrate. The main chip regions may provide a scribe lane region therebetween. After the integrated circuits are formed, the semiconductor substrate in the scribe lane region may be cut to provide a plurality of semiconductor chips physically separated from each other. This process may also be referred to as a die sawing process. The respective discrete semiconductor chips may be encapsulated through an assembly process so that the semiconductor chips are protected from external environments. During the die sawing process, the semiconductor substrate in the scribe lane region and material layers thereon may be physically cut using a sawing blade. Accordingly, stresses caused by physical frictions between the sawing blade and the material layers (or the semiconductor substrate) may be generated in the die sawing process. These stresses may be delivered to material layers constituting the integrated circuit in the main chip region to cause cracks. The cracks may cause a malfunction of the integrated circuit formed in the main chip region, or may degrade the reliability of the integrated circuit.

SUMMARY

The present disclosure may provide semiconductor chips and methods of fabricating the same, which are suitable to inhibit a stress generated during a die sawing process of cutting a scribe lane region from being delivered to a main chip region.

The present disclosure may also provide semiconductor chips and methods of fabricating the same, which are suitable to alleviate a stress generated during a die sawing process of cutting a scribe lane region, and to reduce the width of the scribe lane region.

An example embodiment of the inventive concepts provides a semiconductor chip. The semiconductor chip comprises a semiconductor substrate including a main chip region and a scribe lane region surrounding the main chip region. An insulating layer is disposed over the semiconductor substrate, and a guard ring is disposed in the insulating layer in the scribe lane region. The guard ring surrounds at least a portion of the main chip region. The guard ring has a brittleness greater than a brittleness of the insulating layer.

In some embodiments, the guard ring may be an insulating guard ring. The insulating guard ring may comprise a porous insulating layer. The porous insulating layer may be an insulating layer containing at least one of carbon (C), hydrogen (H), nitrogen (N), and fluorine (F). The porous insulating layer may be one of a Fluorosilicate Glass (FSG) layer, a SiOC layer, a SiOCH layer, a SiLK™ (a trademark of The Dow Chemical Company) resin layer, and a SiN layer.

In other embodiments, the guard ring may be a single loop-shaped guard ring continuously surrounding an edge of the main chip region.

In still other embodiments, the semiconductor chip may further include at least one conductive guard ring in the insulating layer in the scribe lane region. The at least one conductive guard ring may be disposed between the guard ring and the main chip region. The guard ring may have a width less than a width of the at least one conductive guard ring.

In yet other embodiments, the guard ring may vertically penetrate the insulating layer to contact the semiconductor substrate.

In yet still other embodiments, the insulating layer may include a plurality of interlayer dielectric layers that are sequentially stacked.

Another example embodiment of the inventive concepts provides a method of fabricating a semiconductor chip. The method of fabricating the semiconductor chip comprises forming an insulating layer over a semiconductor substrate including a main chip region and a scribe lane region surrounding the main chip region. A guard ring is formed in the insulating layer in the scribe lane region. The guard ring surrounds at least a portion of the main chip region. The guard ring is formed of a material layer having a brittleness greater than a brittleness of the insulating layer.

In some embodiments, the guard ring may be formed of an insulating material layer. The insulating guard ring may be formed of a porous insulating layer. The porous insulating layer may include an insulating layer containing at least one of carbon (C), hydrogen (H), nitrogen (N), and fluorine (F). The porous insulating layer may be one of a Fluorosilicate Glass (FSG) layer, a SiOC layer, a SiOCH layer, a SiLK™ resin layer, and a SiN layer.

In other embodiments, the forming of the guard ring may include: patterning the insulating layer to faun a groove exposing the semiconductor substrate in the scribe lane region, forming a porous insulating layer filling the groove and covering the insulating layer, and planarizing the porous insulating layer to expose an upper surface of the insulating layer. The porous insulating layer may be formed using a plasma chemical vapor deposition technique.

According to still another example embodiment of the inventive concepts, the method of fabricating the semiconductor chip comprises preparing a semiconductor substrate including a main chip region and a scribe lane region surrounding the main chip region, forming an insulating layer over the semiconductor substrate, forming an insulating guard ring in the insulating layer in the scribe lane region and the insulating guard ring surrounds at least a portion of the main chip region. The method further includes foaming at least one conductive guard ring in the insulating layer in the scribe lane region and the at least one conductive guard ring surrounds at least a portion of the main chip region. The insulating guard ring is formed of a material layer having a brittleness greater than a brittleness of the insulating layer.

In some embodiments, the formation of the insulating layer, the insulating guard ring, and the at least one conductive guard ring may comprise forming a lower interlayer dielectric layer over the semiconductor substrate, forming a lower insulating guard ring surrounding the main chip region in the lower interlayer dielectric layer, forming at least one lower conductive guard ring surrounding the main chip region in the lower interlayer dielectric layer, forming an upper interlayer dielectric layer over the lower interlayer dielectric layer, the lower insulating guard ring, and the at least one lower conductive guard ring, forming an upper insulating guard ring that penetrates the upper interlayer dielectric layer to contact the lower insulating guard ring, and forming at least one upper conductive guard ring that penetrates the upper interlayer dielectric layer to contact the at least one lower conductive guard ring.

In other embodiments, the insulating guard ring may be formed of a porous insulating layer. The porous insulating layer may be formed of one of a Fluorosilicate Glass (FSG) layer, a SiOC layer, a SiOCH layer, a SiLK™ resin layer, and a SiN layer.

BRIEF DESCRIPTION OF THE DRAWINGS

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings:

FIGS. 3A through 3E are cross-sectional views illustrating a method of fabricating a semiconductor chip according to an example embodiment of the inventive concept;

FIGS. 4A and 4B are cross-sectional views illustrating a method of fabricating a semiconductor chip according to an example embodiment of the inventive concept.

DETAILED DESCRIPTION OF THE EXAMPLE EMBODIMENTS

Figure 1A:
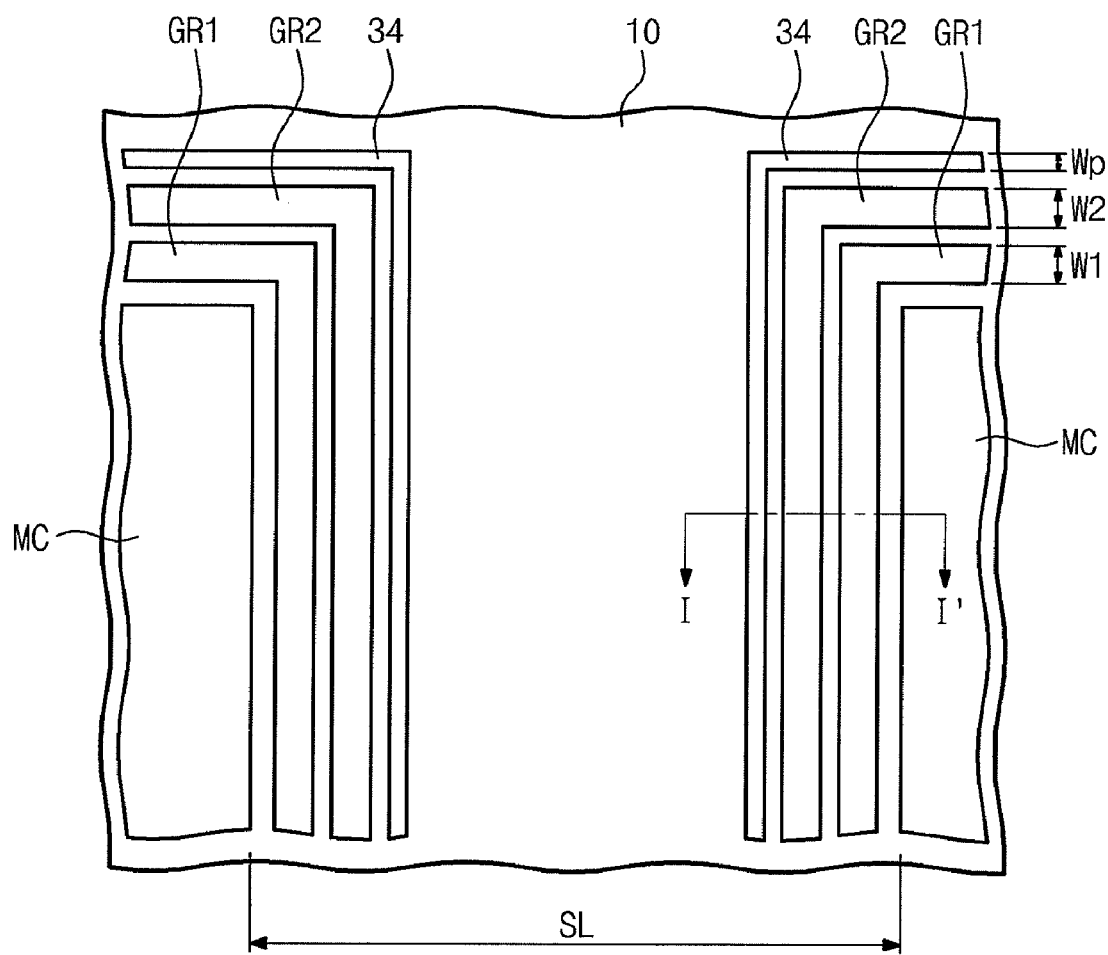
FIG. 1A is a plan view illustrating main chips and a scribe lane therebetween according to an example embodiment of the inventive concept.

Example embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, example embodiments of the inventive concept will be described in detail with reference to the accompanying drawings.

Figure 1B:
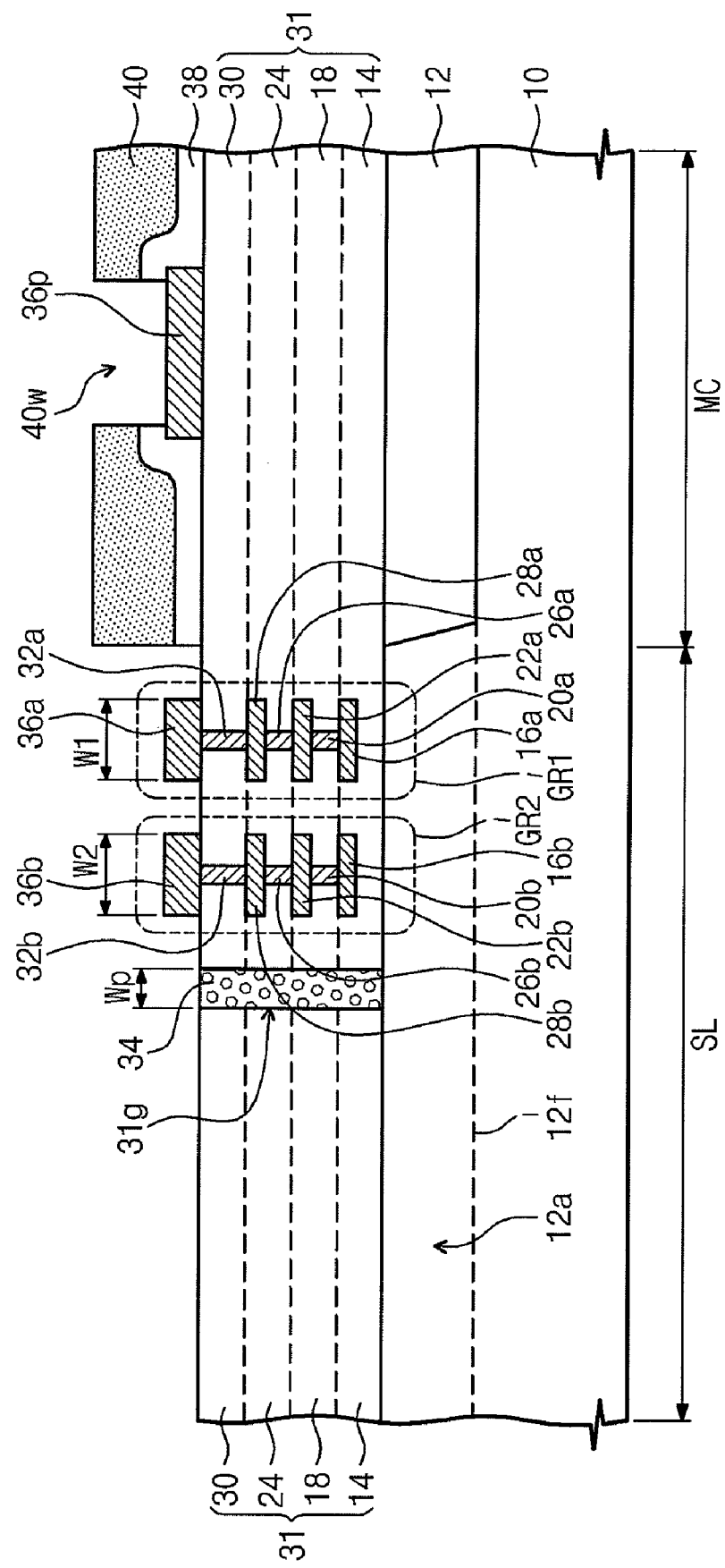
FIG. 1B is a cross-sectional view taken along a line I-I' of FIG. 1A.

FIG. 1A is a plan view illustrating main chips and a scribe lane region therebetween according to an embodiment, and FIG. 1B is a cross-sectional view taken along a line I-I' of FIG. 1A.

Referring to FIGS. 1A and 1B, a semiconductor substrate 10 may be provided to include main chip regions MC and a scribe lane region SL therebetween. A device isolation layer 12 may be disposed in a certain region of the semiconductor substrate 10 to define an active region 12a. The active region 12a may be located in the scribe lane region SL. Unlike this, the device isolation layer 12 may extend into the scribe lane SL as indicated by the dotted line 12f in FIG. 2B.

An insulating layer 31 may be disposed on the entire surface of the semiconductor substrate 10. The insulating layer 31 may include a plurality of stacked interlayer dielectric layers. For example, the insulating layer 31 may include a lower interlayer dielectric layer 14, a first interlayer dielectric layer 18, a second interlayer dielectric layer 24, and an upper interlayer dielectric layer 30.

A main chip, i.e., a semiconductor device may comprise an integrated circuit which is formed in the insulating layer 31 of each of the main chip regions MC. The semiconductor device may comprise a semiconductor memory device or a semiconductor logic device. The integrated circuit may include a plurality of discrete devices such as, for example, transistors, resistors and/or capacitors which are electrically connected to each other.

A guard ring 34 may be disposed in the insulating layer 31 in the scribe lane region SL, thereby surrounding at least a portion of each of the main chip regions MC. The guard ring 34 may be disposed in a groove 31g vertically passing through the insulating layer 31 to contact the semiconductor substrate 10. The guard ring 34 may be a material layer having a brittleness greater than that of the insulating layer 31. The main chip region MC and the guard ring 34 surrounding the main chip region MC may constitute a semiconductor chip.

The term "brittleness" means the properties opposite to "softness". The brittleness relates to the Young's modulus. The meaning of "the brittleness of a first material layer is greater than that of a second material layer" is that "the minimum stress required to destroy the first material layer is less than that required to destroy the second material layer". For example, if the first material layer has a first brittleness and the second material layer adjacent to the first material layer has a second brittleness less than the first brittleness, most of external stress applied to the first material layer may be dispersed and extinguished in the first material layer. Consequently, the first material layer may be destroyed by itself. Accordingly, it can prevent the stress applied to the first material layer from being delivered to the second material layer adjacent to the first material layer. That is, the first insulating layer may serve as a stress buffer for the second insulating layer. Accordingly, even though a stress is applied to the first insulating layer, generation of cracks in the second insulating layer may be significantly suppressed.

In an embodiment, the guard ring 34 may be an insulating guard ring. The insulating guard ring may be, for example, a porous insulating layer. The porous insulating layer may include, for example, an insulating layer containing at least one of carbon, hydrogen, nitrogen, and fluorine. For example, the porous insulating layer may include a fluorosilicate glass (FSG) layer, a SiOC layer, a SiOCH layer, a SiLK™ resin layer, or a SiN layer.

In another embodiment, at least one conductive guard ring may be further disposed in the insulating layer 31 between the main chip region MC and the insulating guard ring 34 surrounding the main chip region MC. For example, the at least one conductive guard ring may include an internal conductive guard ring GR1 and an external conductive guard ring GR2. The internal conductive guard ring GR1 may be disposed in the insulating layer 31 between the insulating guard ring 34 and the main chip region MC, and the external conductive guard ring GR2 may be disposed in the insulating layer 31 between the insulating guard ring 34 and the internal conductive guard ring GR1.

The internal conductive guard ring GR1 may include a lower conductive guard ring 16a in the lower interlayer dielectric layer 14, a first conductive guard ring 22a in the first interlayer dielectric layer 18, the second conductive guard ring 28a in the second interlayer dielectric layer 24, and the upper conductive guard ring 36a on the upper interlayer dielectric layer 30. The lower conductive guard ring 16a, the first conductive guard ring 22a, the second conductive guard ring 28a, and the upper conductive guard ring 36a may be connected to each other through conductive via plugs 20a, 26a and 32a which vertically penetrate the interlayer dielectric layers 18, 24 and 30, respectively. The conductive via plugs 20a, 26a and 32a may also have a loop-shaped configuration when viewed from the top plan view.

Similarly, the external conductive guard ring GR2 may include a lower conductive guard ring 16b, a first conductive guard ring 22b, a second conductive guard ring 28b, and an upper conductive guard ring 36b, which are sequentially stacked in the insulating layer 31. Further, the lower conductive guard ring 16b, the first conductive guard ring 22b, the second conductive guard ring 28b, and the upper conductive guard ring 36b may be connected to each other through conductive via plugs 20b, 26b and 32b which vertically penetrate the interlayer dielectric layers 18, 24 and 30, respectively. The conductive via plugs 20b, 26b and 32b may also have a loop-shaped configuration when viewed from the top plan view.

The conductive guard rings GR1 and GR2 may include a metal layer. For example, the lower conductive guard rings 16a and 16b, the first conductive guard rings 22a and 22b, and the second conductive guard rings 28a and 28b may include a copper layer or a tungsten layer, and the upper conductive guard rings 36a and 36b may include an aluminum alloy layer. The conductive via plugs 20b, 26b and 32b may also include, for example, a copper layer or a tungsten layer.

A bonding pad 36p may be disposed on a certain area of the insulating layer 31 in the main chip region MC. The bonding pad 36p may be the same material layer as the upper conductive guard rings 36a and 36b. The insulating layer 31 in the main chip region MC may be covered with a passivation layer 38 having a pad window 40w which exposes the bonding pad 36p. In addition, a polyimide layer 40 may be disposed on the passivation layer 38.

The width Wp of the insulating guard ring 34 may be less than the width W1 of the internal conductive guard ring GR1 and the width W2 of the external conductive guard ring GR2. Even though the insulating guard ring 34 has the width Wp less than the width W2 of the external conductive guard ring GR2, the insulating guard ring 34 may be more excellent than the external conductive guard ring GR2 in terms of the stress buffer. Accordingly, when the insulating guard ring 34 is employed instead of an additional conductive guard ring, the width of the scribe lane region SL may be significantly reduced without degradation of the stress buffering effect. Consequently, the number of the main chips formed on the semiconductor substrate 10 can be increased by disposing the guard ring 34 having a greater brittleness than the insulating layer 31 inside the insulating layer 31 of the scribe lane region SL.

Figure 2A:
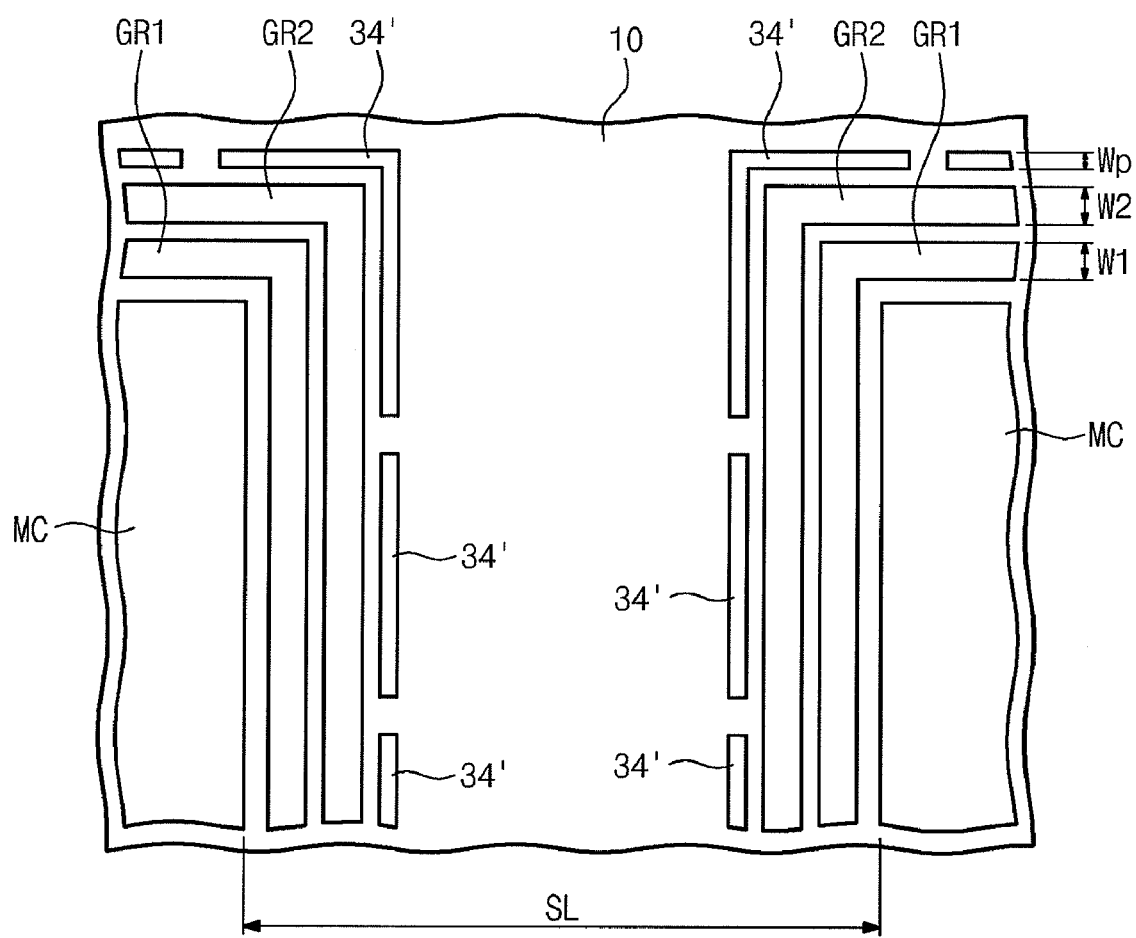
FIG. 2A is a plan view illustrating main chips and a scribe lane therebetween according to an example embodiment of the inventive concept.

FIG. 2A is a plan view illustrating main chips and a scribe lane region therebetween according to another embodiment. This embodiment is different from the embodiment of FIGS. 1A and 1B in terms of the configuration of an insulating guard ring. That is, whereas the insulating guard ring 34 of FIG. 1A has a loop-shaped configuration continuously surrounding the edge of the main chip region MC, an insulating guard ring 34' shown in FIG. 2A may have a configuration discontinuously surrounding the edge of a main chip region MC.

Figure 2B:
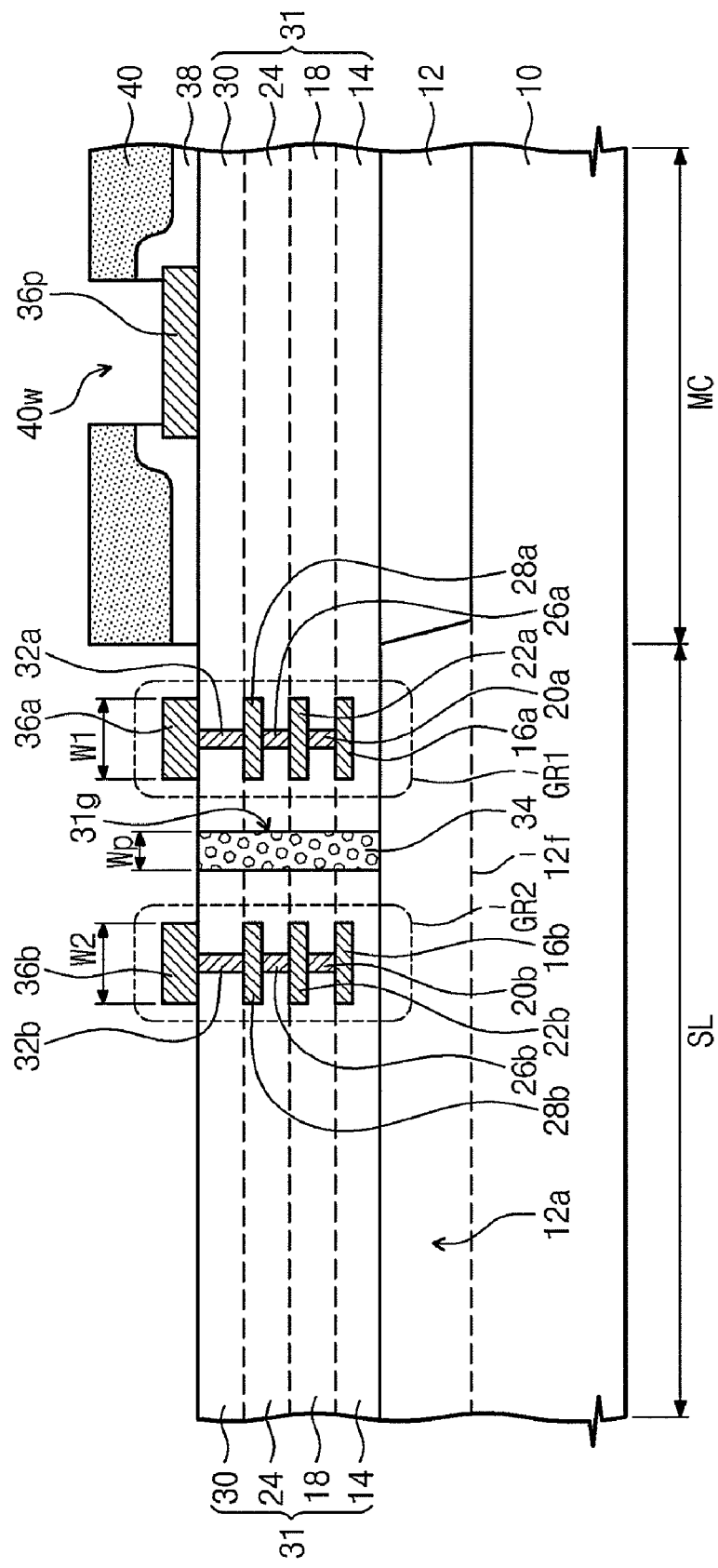
FIG. 2B is a cross-sectional view illustrating a semiconductor chip according to an example embodiment of the inventive concept.

FIG. 2B is a cross-sectional view illustrating a semiconductor chip according to still another embodiment. This embodiment is different from the embodiment of FIGS. 1A and 1B in terms of the location of the insulating guard ring 34. That is, whereas the insulating guard ring 34 of FIG. 1B is disposed at the outermost position, the insulating guard ring 34 of FIG. 2B may be disposed between conductive guard rings GR1 and GR2.

FIGS. 3A through 3E are cross-sectional views illustrating a method of fabricating a semiconductor chip according to an embodiment. This embodiment may correspond to the methods of fabricating semiconductor chips shown in FIG. 1B.

Figure 3A:
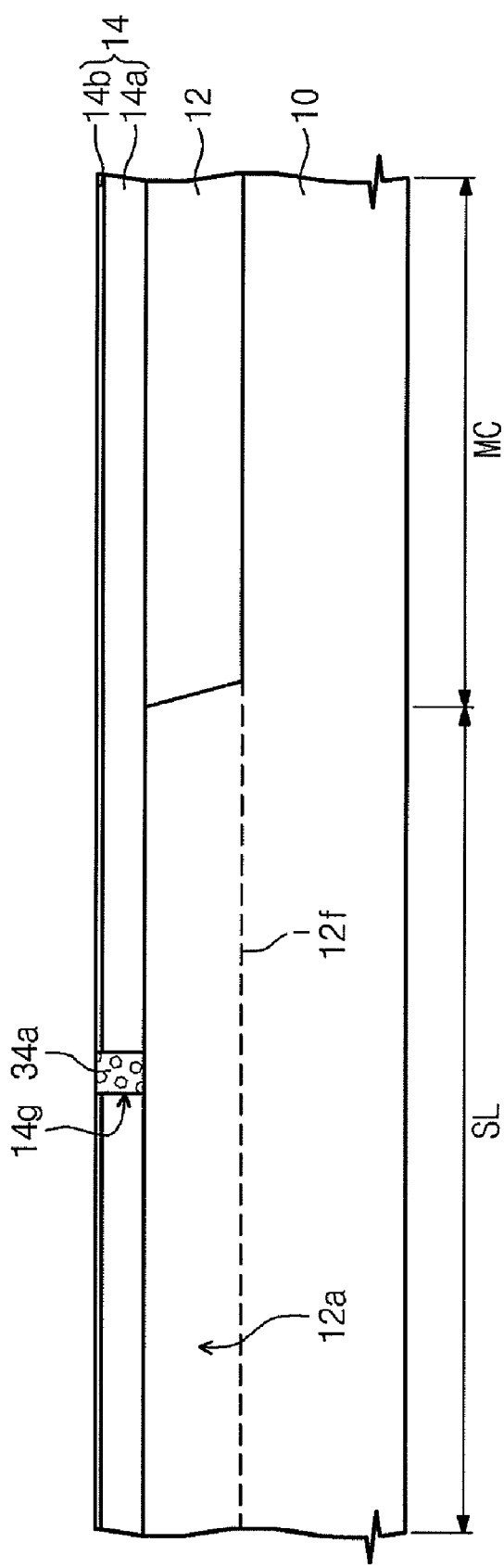

Referring to FIG. 3A, a semiconductor substrate 10, i.e., a semiconductor wafer 10 having a main chip region MC and a scribe lane region SL surrounding the main chip region MC may be provided. A device isolation layer 12 may be formed at a certain area of the semiconductor substrate 10 to define an active region 12a. The device isolation layer 12 may be formed at a certain area of the main chip region MC. In this case, the scribe lane region SL may include the active region 12a. Unlike this, the device isolation layer 12 may be formed to extend into the scribed lane region SL as shown by the dotted line 12f. In this case, the scribe lane region SL may include a portion of the device isolation layer 12.

After the device isolation layer 12 is formed, discrete active devices such as, for example, transistors and discrete passive devices such as resistors may be formed in the semiconductor substrate 10 within the main chip region MC. A lower interlayer dielectric layer 14 may be formed on the entire surface of the semiconductor substrate 10 including the transistors and the resistors. The lower interlayer dielectric layer 14 may be formed by sequentially stacking a lower insulating layer 14a and a lower polishing stop layer 14b. For example, the lower insulating layer 14a may be formed of a silicon oxide layer, and the lower polishing stop layer 14b may be formed of a silicon nitride layer.

The lower interlayer dielectric layer 14 may be patterned to form a lower groove 14g in the scribe lane region SL. The lower groove 14g may be formed to have a loop-shaped configuration continuously surrounding the main chip region MC. A lower guard ring layer having a brittleness greater than the lower interlayer dielectric layer 14 may be formed on the entire surface of the substrate having the lower groove 14g. The lower guard ring layer may be foamed using a chemical vapor deposition technique, for example, a plasma chemical vapor deposition technique.

In an embodiment, the lower guard ring layer may be formed of an insulating material layer, i.e., a lower insulating guard ring layer. The lower insulating guard ring layer may be formed of a porous insulating layer. The porous insulating layer may be formed of, for example, an insulating layer containing at least one of carbon, hydrogen, nitrogen, and fluorine. For example, the porous insulating layer may be formed of a Fluorosilicate Glass (FSG) layer, a SiOC layer, a SiOCH layer, a SiLK™ resin layer, and a SiN layer.

The lower guard ring layer may be planarized to expose the upper surface of the lower interlayer dielectric layer 14. Consequently, a lower insulating guard ring 34a having a loop-shaped configuration, i.e., a lower insulating guard ring may be formed in the lower groove 14g.

Referring to FIG. 3B, a pair of lower conductive guard rings 16a and 16b may be formed in the lower interlayer dielectric layer 14. The pair of lower conductive guard rings 16a and 16b may be formed to surround the main chip region MC. The lower conductive guard ring 16a may be formed between the lower insulating guard ring 34a and the main chip region MC, and the lower conductive guard ring 16b may be formed between the lower insulating guard ring 34a and the lower conductive guard ring 16a. The lower conductive guard rings 16a and 16b may be formed using, for example, a damascene process. The lower conductive guard rings 16a and 16b may be formed of a metal layer, e.g., a tungsten layer or a copper layer.

In an embodiment, lower conductive via plugs 15a and 15b may be additionally formed in the lower interlayer dielectric layer 14 under the lower conductive guard rings 16a and 16b, respectively. The lower conductive via plugs 15a and 15b may be formed of, for example, a tungsten layer or a copper layer. The lower conductive via plug 15a may contact the lower conductive guard ring 16a and may extend to the upper surface of the semiconductor substrate 10. Similarly, the lower conductive via plug 15b may contact the lower conductive guard ring 16b and may extend to the upper surface of the semiconductor substrate 10. The lower conductive guard rings 16a and 16b and the lower conductive via plugs 15a and 15b may be formed using, for example, a dual damascene process.

In another embodiment, the lower conductive guard rings 16a and 16b and the lower conductive via plugs 15a and 15b may be formed prior to formation of the lower insulating guard ring 34a.

Figure 3C:
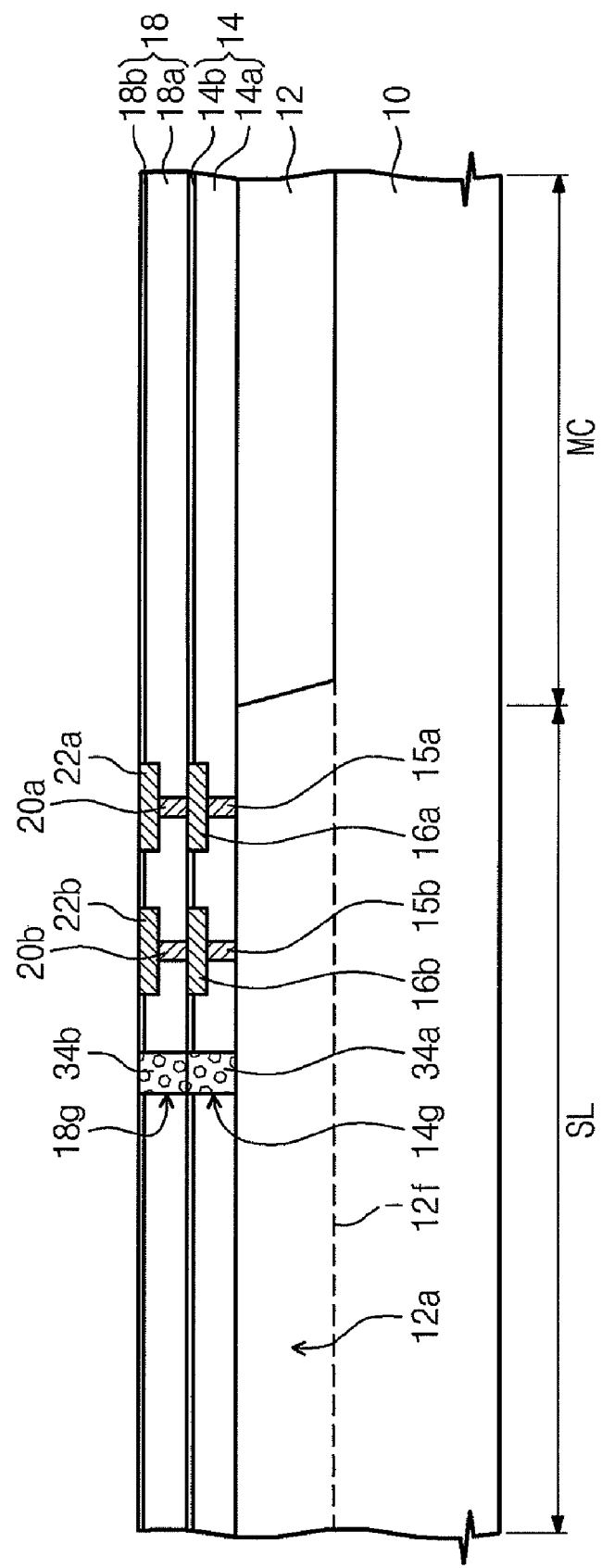

Referring to FIG. 3C, a first interlayer dielectric layer 18 may be formed over the substrate including the lower insulating guard ring 34a and the lower conductive guard rings 16a and 16b. The first interlayer dielectric layer 18 may be formed using the same manner as the method for forming the lower interlayer dielectric layer 14 described with the reference to FIG. 3A. That is, the first interlayer dielectric layer 18 may be formed by, for example, stacking a first insulating layer 18a and a first polishing stop layer 18b sequentially.

The first interlayer dielectric layer 18 may be patterned to form a first groove 18g exposing the lower insulating guard ring 34a. The first groove 18g may also be formed to have the same configuration as the lower groove 14g. A first guard ring 34b, i.e., a first insulating guard ring may be formed in the first groove 18g using the same manner as the method for forming the lower insulating guard ring 34a illustrated in FIG. 3A.

Furthermore, a pair of first conductive via plugs 20a and 20b and a pair of first conductive guard rings 22a and 22b may be formed in the first interlayer dielectric layer 18. The first conductive guard ring 22a may be connected to the lower conductive guard ring 16a through the first conductive via plug 20a, and the first conductive guard ring 22b may be connected to the lower conductive guard ring 16b through the first conductive via plug 20b.

The pair of the first conductive via plugs 20a and 20b and the pair of the first conductive guard rings 22a and 22b may be formed in the same manner as the method for forming the lower conductive via plugs 15a and 15b and the lower conductive guard rings 16a and 16b illustrated in FIG. 3B.

Figure 3D:
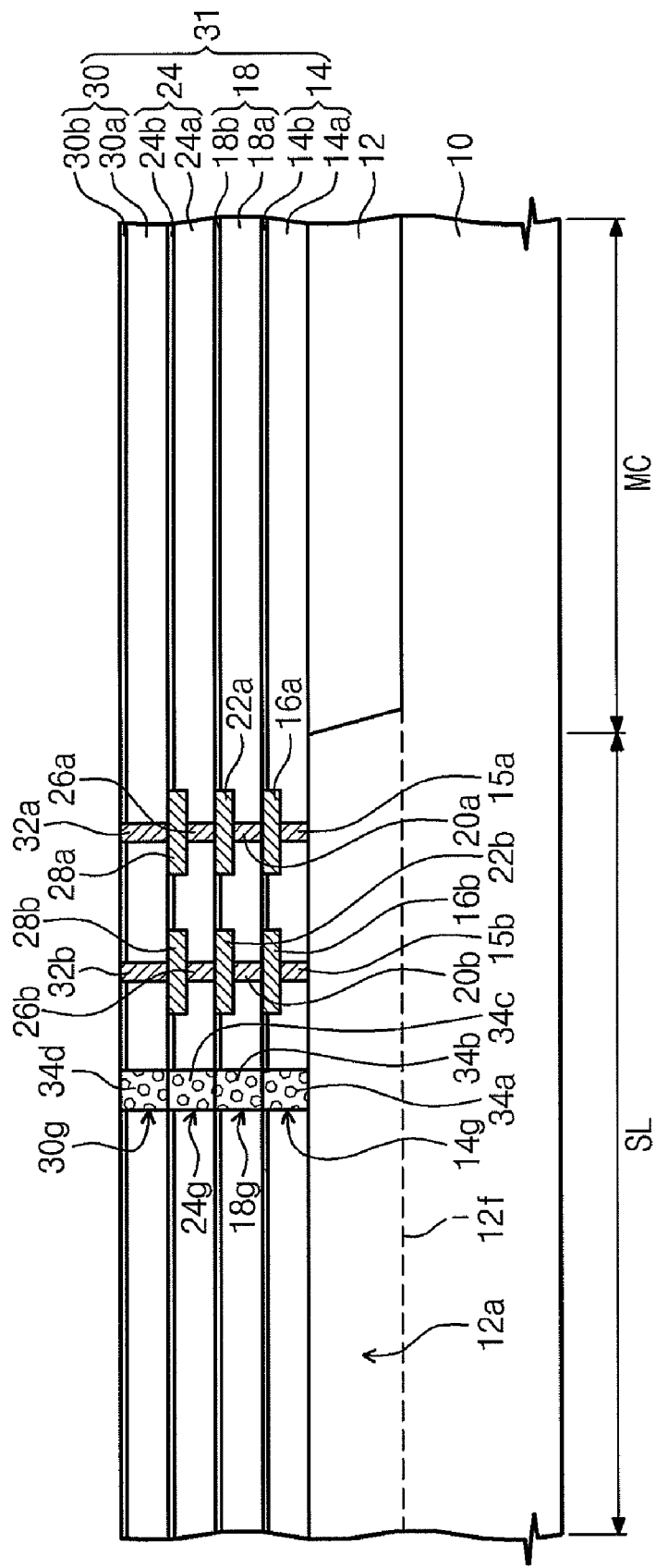

Referring to FIG. 3D, a second interlayer dielectric layer 24 may be formed on the entire surface of the substrate including the first insulating guard ring 34b and the first conductive guard rings 22a and 22b. The second interlayer dielectric layer 24 may also be formed by, for example, stacking a second insulating layer 24a and a second polish stop layer 24b sequentially.

The second interlayer dielectric layer 24 may be patterned to form a second groove 24g exposing the first insulating guard ring 34b. The second groove 24g may also be formed to have the same configuration as the lower groove 14g. A second guard ring 34c, i.e., a second insulating guard ring may be formed in the second groove 24g using the same manner as the method for forming the lower guard ring 34a illustrated in FIG. 3A.

Furthermore, a pair of second conductive via plugs 26a and 26b and a pair of second conductive guard rings 28a and 28b may be formed in the second interlayer dielectric layer 24. The second conductive guard ring 28a may be connected to the first conductive guard ring 22a through the second conductive via plug 26a, and the second conductive guard ring 28b may be connected to the first conductive guard ring 22b through the second via plug 26b.

The pair of the second conductive via plugs 26a and 26b and the pair of the second conductive guard rings 28a and 28b may be formed using the same manner as the method for forming the lower conductive via plugs 15a and 15b and the lower conductive guard rings 16a and 16b illustrated in FIG. 3B.

An upper interlayer dielectric layer 30 may be formed on the entire surface of the substrate including the second insulating guard ring 34c and the second conductive guard rings 28a and 28b. The upper interlayer dielectric layer 30 may also be formed by, for example, stacking an upper insulating layer 30a and an upper polishing stop layer 30b sequentially.

The upper interlayer dielectric layer 30 may be patterned to form an upper groove 30g exposing the second insulating guard ring 34c. The upper groove 30g may also be formed to have the same configuration as the lower groove 14g. An upper guard ring 34d, i.e., an upper insulating guard ring 34d may be formed in the upper groove 30g in the same manner as the method for forming the lower guard ring 34a illustrated in FIG. 3A.

Furthermore, a pair of upper conductive via plugs 32a and 32b may be formed in the upper interlayer dielectric layer 30. The upper conductive via plugs 32a and 32b may be formed to contact the second conductive guard rings 28a and 28b, respectively. The upper conductive via plugs 32a and 32b may also be formed of a metal layer, e.g., a tungsten layer or a copper layer.

The lower interlayer dielectric layer 14, the first interlayer dielectric layer 18, the second interlayer dielectric layer 24, and the upper interlayer dielectric layer 30 may constitute an insulating layer 31.

Figure 3E:
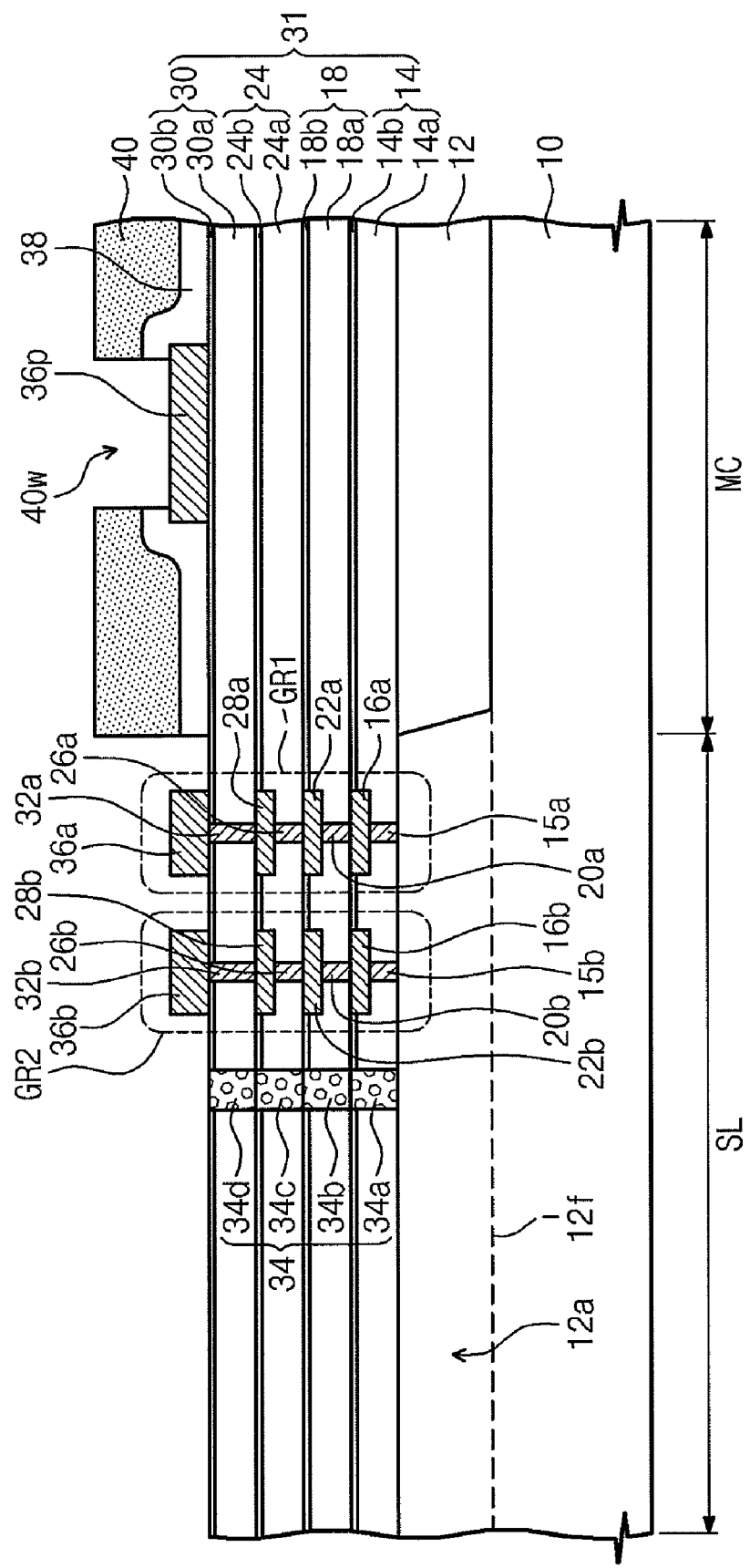

Referring to FIG. 3E, the lower guard ring 34a, the first guard ring 34b, the second guard ring 34c, and the upper guard ring 34d may constitute a guard ring 34 surrounding at least a portion of the main chip region MC. A metal layer, e.g., an aluminum alloy layer may be formed over the substrate including the guard ring 34 and the upper conductive via plugs 32a and 32b, and then the metal layer may be patterned to form a bonding pad 36p in the main chip region MC and internal/external conductive interconnections 36a and 36b in the scribe lane region SL.

The internal/external conductive interconnections 36a and 36b may also be formed to have a shape surrounding the main chip region MC. The internal conductive interconnection 36a may be formed to contact the upper conductive via plug 32a, and the external conductive interconnection 36b may be formed to contact the upper conductive via plug 32b.

The lower conductive via plug 15a, the lower conductive guard ring 16a, the first conductive via plug 20a, the first conductive guard ring 22a, the second conductive via plug 26a, the second conductive guard ring 28a, the upper conductive via plug 32a, and the internal conductive interconnection 36a may constitute an internal conductive guard ring GR1. Similarly, the lower conductive via plug 15b, lower conductive guard ring 16b, the first conductive via plug 20b, the first conductive guard ring 22b, the second conductive via plug 26b, the second conductive guard ring 28b, the upper conductive via plug 32b, and the external conductive interconnection 36b may constitute an external conductive guard ring GR2.

A passivation layer 38 may be formed on the entire surface of the substrate including the bonding pad 36p and the internal/external conductive interconnections 36a and 36b, and then the passivation layer 38 may be patterned to form a pad window 40w exposing the bonding pad 36p. A polyimide layer 40 may be formed on the substrate including the patterned passivation layer 38, and then the polyimide layer 40 may be patterned to expose the bonding pad 36p. While the polyimide layer 40 is patterned, the polyimide layer 40 in the scribe lane region SL may be selectively removed.

A method for fabricating the semiconductor chip according to an embodiment of the inventive concept is not limited to the above embodiment described with reference to FIGS. 3A through 3E. For example, the embodiment of FIGS. 3A through 3E may also be applied to the embodiment of FIG. 2A. That is, the embodiment of FIGS. 3A through 3E may be applied to fabrication of the semiconductor chip including the insulating guard ring 34' discontinuously surrounding the main chip region MC as illustrated in FIG. 2A. In addition, the embodiment of FIGS. 3A through 3E may be applied to fabrication of the semiconductor chip including the insulating guard ring 34 between the conductive guard rings GR1 and GR2 as illustrated in FIG. 2B.

Figure 4A:
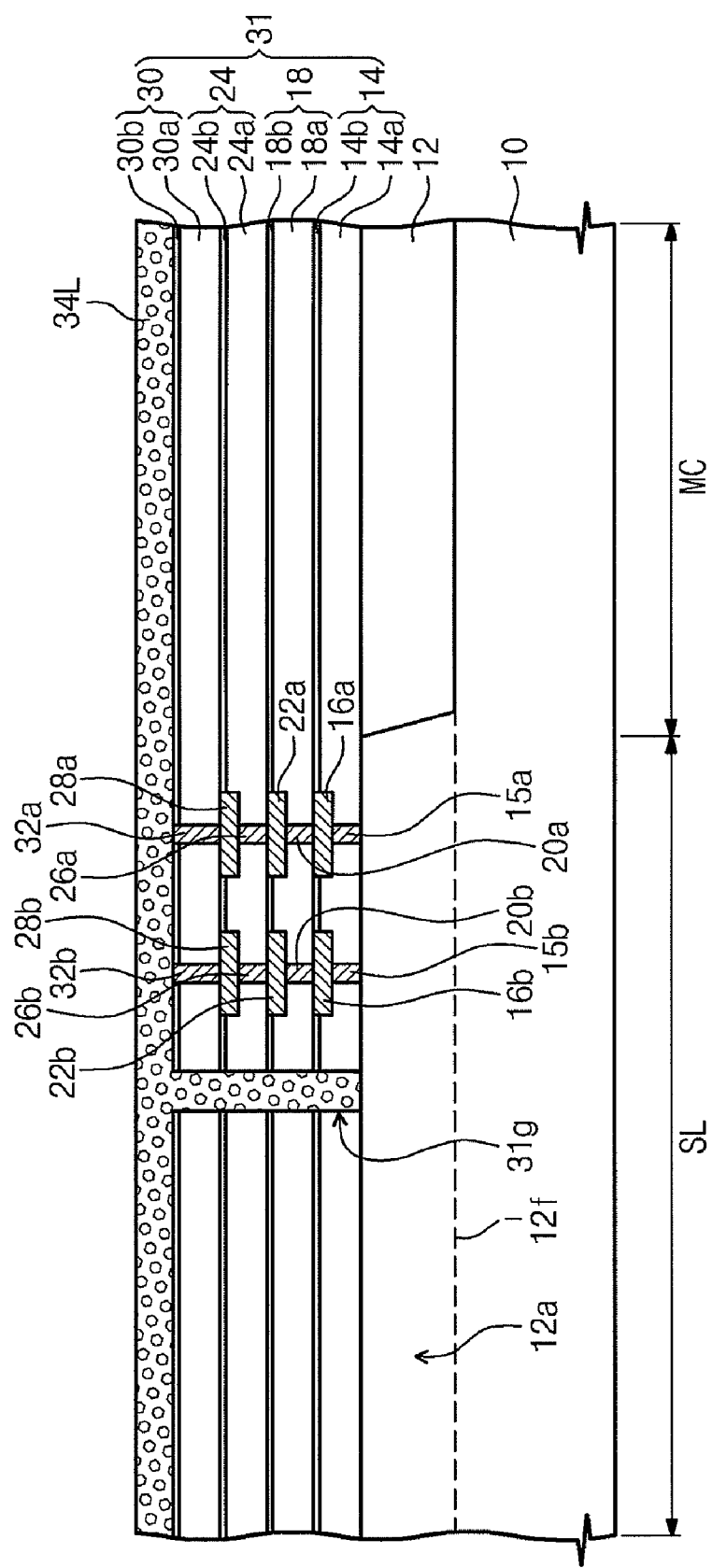

FIGS. 4A and 4B are cross-sectional views illustrating a method of fabricating a semiconductor chip according to another embodiment. This embodiment is different from the embodiment of FIGS. 3A through 3E in the method for forming the guard ring 34. Accordingly, the same process steps as the embodiment illustrated in FIGS. 3A through 3E will be omitted or briefly described herein.

Referring to FIGS. 4A and 4B, an insulating layer 31 including a plurality of interlayer dielectric layers 14, 18, 24 and 30 may be formed over a semiconductor substrate 10, and then the insulating layer 31 may be patterned to form a groove 31g discontinuously or continuously surrounding the main chip region MC. A guard ring layer 34L having a brittleness greater than the insulating layer 31 may be formed over the substrate having the groove 31g. The guard ring layer 34L may be formed using a chemical vapor deposition technique, e.g., a plasma chemical vapor deposition technique.

The guard ring layer 34L may be formed of the same material layer as the insulating guard rings of the embodiment described with reference to FIGS. 3A through 3E. The guard ring layer 34L may be planarized to expose the upper surface of the insulating layer 31. Consequently, a guard ring 34, i.e., an insulating guard ring may be formed in the groove 31g. Thereafter, a bonding pad, internal/external conductive interconnections, a passivation layer, and a polyimide layer may be formed using the same method as described with reference to FIG. 3E.

Figure 5:
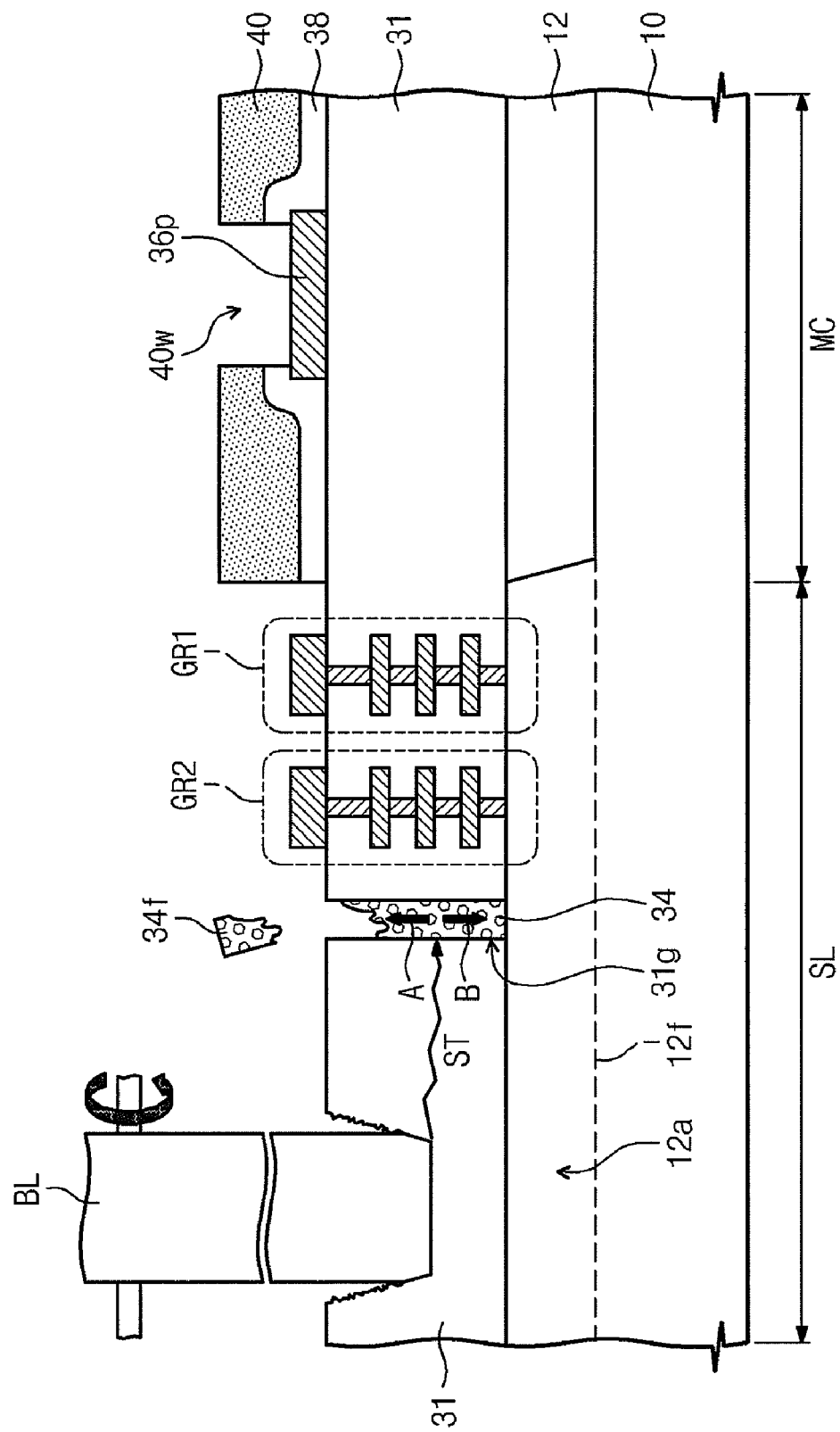
FIG. 5 is a cross-sectional view illustrating a process of cutting a scribe lane region to separate semiconductor chips according to an example embodiment of the inventive concept.

FIG. 5 is a cross-sectional view illustrating a die sawing process for physically separating semiconductor chips from each other according to an embodiment.

Referring to FIG. 5, the semiconductor chips fabricated according to embodiments of the inventive concept should be physically separated from each other through a die sawing process. The die sawing process can be achieved by cutting a scribe lane region SL of a semiconductor substrate 10 using a sawing blade BL.

During the die sawing process, a stress ST may be generated in the scribe lane region SL as described in FIG. 5. The stress ST may be applied to a guard ring 34, e.g., an insulating guard ring surrounding at least a portion of a main chip region MC. The stress ST may be dispersed in the upward and downward directions as shown by the arrows "A" and "B" and extinguished in the insulating guard ring 34. Accordingly, the insulating guard ring 34 may be destroyed by itself, and some portions of the insulating guard ring 34 may be detached from the scribe lane region SL. This is because the guard ring 34 may be formed of a material layer having a brittleness greater than the insulating layer 31. Accordingly, the stress ST generated in the scribe lane region SL during the die sawing process can be considerably alleviated because of the presence of the guard ring 34. That is, the guard ring 34 may suppress the stress ST applied to the scribe lane SL from being delivered to the main chip region MC. Consequently, due to the presence of the guard ring 34, it can prevent defects such as cracks from being generated in the main chip region MC at least during the die sawing process.

According to embodiments of the inventive concept, a guard ring surrounding a main chip region may have a brittleness greater than those of insulating layers formed over the semiconductor substrate. Accordingly, even though a stress is generated during a die sawing process of cutting a scribe lane region surrounding the main chip region, the stress can be considerably reduced. Consequently, as cracks can be inhibited in insulating layers forming an integrated circuit in the main chip region, the reliability of the integrated circuit can be improved.

In addition, the guard ring is more excellent than a conductive guard ring in terms of stress-blocking performance. Accordingly, the width of the guard ring can be less than the width of the conductive guard ring. Consequently, the width of the scribe lane region between the main chip regions can be reduced, thereby maximizing the number of main chips formed in one semiconductor substrate.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:
1. A semiconductor chip comprising:
a semiconductor substrate including a main chip region and a scribe lane region surrounding the main chip region;
an insulating layer disposed over the semiconductor substrate; and an insulating guard ring disposed in the insulating layer in the scribe lane region, the insulating guard ring surrounding at least a portion of the main chip region, wherein the insulating guard ring vertically penetrates the insulating layer to contact the semiconductor substrate and wherein the insulating guard ring has a brittleness greater than a brittleness of the insulating layer.

2. The semiconductor chip of claim 1, wherein the insulating guard ring is a porous insulating layer.

3. The semiconductor chip of claim 2, wherein the porous insulating layer comprises at least one of carbon (C), hydrogen (H), nitrogen (N), and fluorine (F).

4. The semiconductor chip of claim 3, wherein the porous insulating layer is one of a Fluorosilicate Glass (FSG) layer, a SiOC layer, a SiOCH layer, and a SiN layer.

5. The semiconductor chip of claim 1, wherein the insulating guard ring is a single loop-shaped guard ring continuously surrounding an edge of the main chip region.

6. The semiconductor chip of claim 1, further comprising at least one conductive guard ring disposed in the insulating layer in the scribe lane region.

7. The semiconductor chip of claim 6, wherein the at least one conductive guard ring is disposed between the insulating guard ring and the main chip region.

8. The semiconductor chip of claim 7, wherein the insulating guard ring has a width less than a width of the at least one conductive guard ring.

9. A semiconductor chip comprising:
a semiconductor substrate including a main chip region and a scribe lane region surrounding the main chip region;
an insulating layer disposed over the semiconductor substrate;
an insulating guard ring disposed in the insulating layer in the scribe lane region, the insulating guard ring surrounding at least a portion of the main chip region; and
at least one conductive guard ring disposed in the insulating layer in the scribe lane region, wherein the at least one conductive guard ring includes a metal layer,
and wherein the insulating guard ring has a brittleness greater than a brittleness of the insulating layer.

10. The semiconductor chip of claim 9, wherein the insulating layer includes a lower interlayer dielectric layer, a first interlayer dielectric layer, a second interlayer dielectric layer and an upper interlayer dielectric layer sequentially stacked on the semiconductor substrate.

11. The semiconductor chip of claim 9, wherein the at least one conductive guard ring includes an internal conductive guard ring and an external conductive guard ring each disposed in the insulating layer in the scribe lane region.

12. The semiconductor chip of claim 11, wherein the internal conductive guard ring and the external conductive guard ring each include a lower conductive guard ring disposed in the lower interlayer dielectric layer, a first conductive guard ring disposed in the first interlayer dielectric layer, a second conductive guard ring disposed in the second interlayer dielectric layer, and an upper conductive guard ring disposed on the upper interlayer dielectric layer, wherein the lower conductive guard ring, the first conductive guard ring, the second conductive guard ring, and the upper conductive guard ring are connected to each other through a plurality of conductive via plugs which vertically penetrate the first interlayer dielectric layer, the second interlayer dielectric layer and the upper interlayer dielectric layer, respectively.

13. The semiconductor chip of claim 12, wherein the conductive via plugs have a loop-shaped configuration when viewed from a top plan view.

14. The semiconductor chip of claim 12, wherein the conductive via plugs include one of a copper layer or a tungsten layer.

15. The semiconductor chip of claim 11, wherein the insulating guard ring is disposed in a groove vertically passing through the insulating layer to contact the semiconductor substrate.

16. The semiconductor chip of claim 11, wherein the internal conductive guard ring is disposed in the insulating layer between the insulating guard ring and the main chip region, and wherein the external conductive guard ring is disposed in the insulating layer between the insulating guard ring and the internal conductive guard ring.

17. The semiconductor chip of claim 11, wherein the insulating guard ring is disposed between the internal conductive guard ring and the external conductive guard ring.

18. The semiconductor chip of claim 12, wherein the lower conductive guard ring, the first conductive guard ring, and the second conductive guard ring of the internal conductive guard ring and the external conductive guard ring include one of a copper layer or a tungsten layer, and wherein the upper conductive guard ring of the internal conductive guard ring and the external conductive guard ring include an aluminum alloy layer.

19. The semiconductor chip of claim 12, further comprising:
a bonding pad disposed on an upper surface of the insulating layer in the main chip region, wherein the bonding pad is formed of a same material as the upper conductive guard ring of the internal conductive guard ring and the external conductive guard ring;
a passivation layer covering the insulating layer in the main chip region, wherein the passivation layer has a pad window which exposes an upper surface of the bonding pad; and
a polyimide layer disposed on the passivation layer.

20. The semiconductor chip of claim 9, wherein a width of the insulating guard ring is less than a width of the internal conductive guard ring and a width of the external conductive guard ring.

* * * * *